United States Patent
Chen et al.

(10) Patent No.: US 8,748,952 B2
(45) Date of Patent: *Jun. 10, 2014

(54) CO-IMPLANT FOR BACKSIDE ILLUMINATION SENSOR

(71) Applicant: Taiwan Semiconductor Manufacturing Company, Ltd., Hsin-Chu (TW)

(72) Inventors: Cheng-Tsung Chen, Hsin-Chu (TW); Hsun-Ying Huang, Tainan (TW); Yung-Cheng Chang, Zhubei (TW); Yung-Fu Yeh, Sikou Township (TW); Yu-Ping Chen, Hsin-Chu (TW); Chi-Yuan Liang, Taichung (TW); Shou Shu Lu, Kaohsiung (TW); Juan-Lin Chen, Shanhua Township (TW); Jia-Ren Chen, Tainan (TW); Horng-Daw Shen, Hsin-Chu (TW); Chi-Hsun Hsieh, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/891,993

(22) Filed: May 10, 2013

(65) Prior Publication Data

US 2013/0249037 A1    Sep. 26, 2013

Related U.S. Application Data

(63) Continuation of application No. 13/174,073, filed on Jun. 30, 2011, now Pat. No. 8,466,530.

(51) Int. Cl.
*H01L 27/146* (2006.01)

(52) U.S. Cl.
CPC .................. *H01L 27/1464* (2013.01)
USPC ........ 257/291; 257/E27.133; 438/73; 438/527

(58) Field of Classification Search
USPC .......... 257/292, 432, E27.133, 291, E27.134; 438/73, 87, 57, 66, 527
See application file for complete search history.

(56) References Cited

U.S. PATENT DOCUMENTS

| 7,452,742 | B2 | 11/2008 | Kanbe |
| 7,843,027 | B2 | 11/2010 | Kanbe |
| 8,084,286 | B2 | 12/2011 | Kanbe |
| 8,164,126 | B2 | 4/2012 | Moon et al. |
| 8,378,402 | B2 | 2/2013 | Moon et al. |

(Continued)

FOREIGN PATENT DOCUMENTS

| JP | H 11251322 A | 9/1999 |
| JP | 2008182042 A | 8/2008 |
| JP | 2008 211220 A | 9/2008 |
| JP | 2009272423 A | 11/2009 |

(Continued)

*Primary Examiner* — Whitney T Moore
(74) *Attorney, Agent, or Firm* — Slater and Matsil, L.L.P.

(57) ABSTRACT

A system and method for image sensing is disclosed. An embodiment comprises a substrate with a pixel region, the substrate having a front side and a backside. A co-implant process is performed along the backside of the substrate opposing a photosensitive element positioned along the front side of the substrate. The co-implant process utilizes a first pre-amorphization implant process that creates a pre-amorphization region. A dopant is then implanted wherein the pre-amorphization region retards or reduces the diffusion or tailing of the dopants into the photosensitive region. An anti-reflective layer, a color filter, and a microlens may also be formed over the co-implant region.

20 Claims, 7 Drawing Sheets

(56) References Cited

U.S. PATENT DOCUMENTS

2008/0283726 A1  11/2008  Uya et al.
2009/0200585 A1   8/2009  Nozaki et al.
2009/0302411 A1  12/2009  Massetti

FOREIGN PATENT DOCUMENTS

| JP | 2009272596 A | 11/2009 |
| JP | 2010278472 A | 12/2010 |
| JP | 2011061092 A | 3/2011 |
| KR | 2006 0048661 A | 5/2006 |
| KR | 10 2007 0027109 A | 3/2007 |

CO-IMPLANT FOR BACKSIDE ILLUMINATION SENSOR

RELATED APPLICATIONS

This application is a continuation of U.S. patent application Ser. No. 13/174,073, filed on Jun. 30, 2011, entitled "Co-implant for Backside Illumination Sensor," which is herein incorporated by reference.

BACKGROUND

Complementary metal oxide semiconductor (CMOS) image sensors are gaining in popularity over traditional charged-coupled devices (CCDs) due to certain advantages inherent in the CMOS image sensors. In particular, CMOS image sensors typically require lower voltages, consume less power, enable random access to image data, may be fabricated with compatible CMOS processes, and enable integrated single-chip cameras.

CMOS image sensors utilize light-sensitive CMOS circuitry to convert light energy into electrical energy. The light-sensitive CMOS circuitry typically comprises a photodiode formed in a silicon substrate. As the photodiode is exposed to light, an electrical charge is induced in the photodiode. The photodiode is typically coupled to a MOS switching transistor, which is used to sample the charge of the photodiode. Colors may be determined by placing filters over the light-sensitive CMOS circuitry.

The light received by pixels of the CMOS image sensor is often based on the three primary colors: red, green, and blue (R, G, B), and additional colors can be identified and/or created with various combinations and intensities (e.g., when red and green overlap they form yellow). Pixel sensitivity for receiving the incident light, however, is lowered with the trend of size reduction of pixels of the CMOS image sensor and cross-talk is caused between different pixels against incident light, especially against incident light with a long wavelength such as the red light (wavelength of about 650 nm), thereby degrading the overall performance of pixels of the CMOS image sensor.

As is known, image sensors can be designed to be illuminated from a front surface or from a back surface. Backside illumination image sensors provide an advantageous feature wherein the need to carefully place and route metallization features so as not to interfere with the optical path is eliminated, because the illumination comes from the backside of the wafer, whereas metallization is formed on the front side of the wafer. Additionally, the overall optical path, i.e., the optical distance from the focusing lens of the sensor to the actual light receiving surface of the sensor itself is typically reduced with backside illumination, relative to front-side illumination because the light need not travel through the metallization and inter-metal dielectric layers.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of the present invention are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

This disclosure describes a specific embodiment utilizing specific dopants and configurations for illustrative purposes only. Other embodiments, however, may utilize other configurations and dopants. For example, other embodiments may utilize an n-type substrate (in combination with different dopants for the specific regions), different circuit layouts, different dopant profiles, different physical layouts, different devices, and the like.

Figure 1:
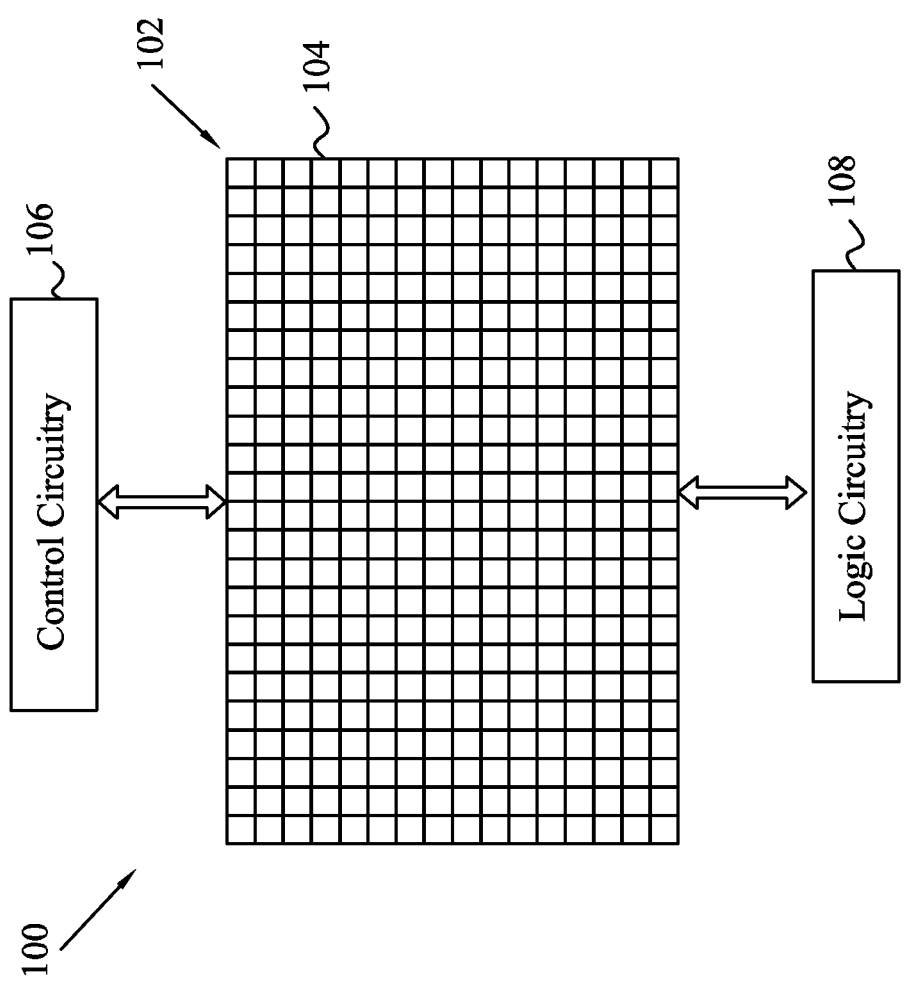
FIG. 1 illustrates an imaging system in accordance with an embodiment.

Referring first to FIG. 1, there is shown an image sensor 100 which comprises an imaging region 102, which comprises a grid or array of pixel regions 104. Each pixel region 104 generates a signal related to the intensity or brightness of light that impinges on the respective pixel region 104. In an embodiment, the grid or array of pixel regions 104 may be arranged in rows and columns, such as that illustrated in FIG. 1. Other embodiments may utilize different configurations, such as staggered pixel regions, a single row/column of pixel regions, a single pixel region, or the like. Furthermore, each pixel region 104 may be a backside illumination device.

The image sensor 100 also may comprise a control circuitry 106, which may be located adjacent to the imaging region 102. The control circuitry 106 may have additional circuitry and contacts for input and output connections to and from the array of pixel regions 104. The control circuitry 106 is utilized to provide an operating environment for the pixel regions 104. The image sensor 100 may also include a logic circuitry 108, which includes the circuitry for reading values from the imaging region 102 and performing any post-acquisition processing, e.g., image zoom, image brightness/contrast, rotate/crop functionality, etc. A person of ordinary skill in the art will realize that the functional diagram of FIG. 1 is simplified and that a system may include many more components, such as amplifiers, power lines, reset lines, and the like.

Figure 2:
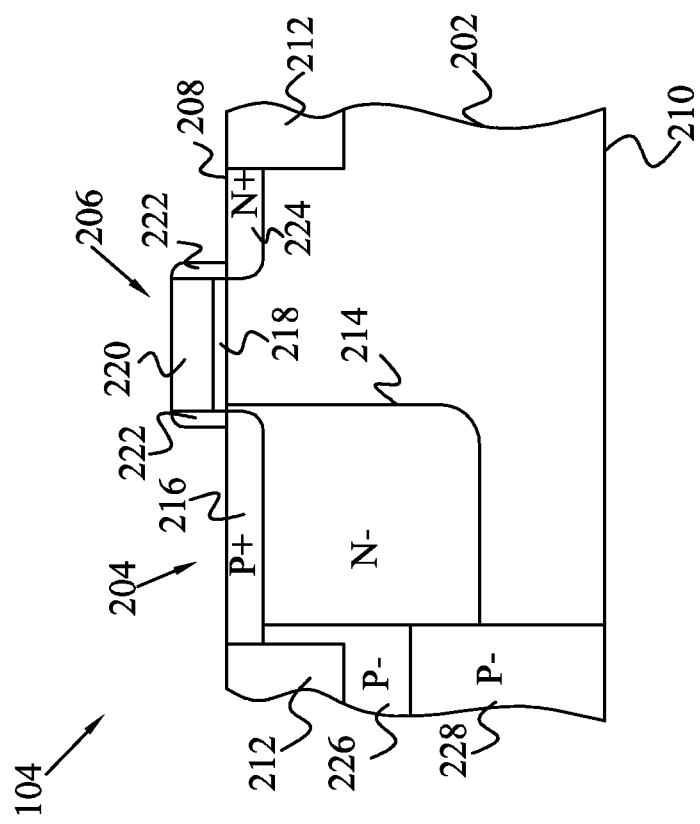
FIGS. 2-6 illustrate a method of forming an imaging system in accordance with an embodiment.

FIGS. 2-6 illustrate a method of forming the pixel region 104 in accordance with an embodiment. Referring first to FIG. 2, there is shown a substrate 202 having a photosensitive element 204 and a transfer transistor 206. The substrate 202 may comprise a front side 208 and a back side 210 and may be a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 202 may be doped with a p-type dopant, such as boron, aluminum, gallium, or the like, although the substrate may alternatively be doped with an n-type dopant, as is known in the art.

The substrate 202 additionally comprises a plurality of isolation structures 212 designed to separate and isolate various devices formed on the substrate 202, and also to separate adjacent pixel regions 104 and the pixel region 104 from, e.g., the logic region 106. The isolation structures 212 may be shallow trench isolations generally formed by etching the substrate 202 to form a trench and filling the trench with dielectric material as is known in the art. The isolation structures 212 may be filled with a dielectric material such as an oxide material, a high-density plasma (HDP) oxide, or the like, formed by conventional methods known in the art.

The photosensitive element 204 senses the amount of light that impinges the photosensitive element 204 from the back side 210 of the substrate 202, and may include a pinned layer photodiode. The pinned layer photodiode may comprise an N− doped region 214 formed in the p-type substrate 202 and a P+ region 216 (referred to as the pinned layer) formed on the surface of the N− doped region 214 to form a p-n-p junction. The P+ doped region 216 and N− doped region 214 may be formed using suitable implantation processes to implant p-type dopants (e.g., boron, gallium, indium, or the like) and n-type dopants (e.g., phosphorous, arsenic, antimony, or the like). In an embodiment, the P+ doped region 216 has a dopant concentration of about 1E13 to about 1E14, and the N− doped region 214 has a dopant concentration of about 1E11 to about 1E13.

Further, as one of ordinary skill in the art will recognize, the pinned layer photodiode described above is merely one type of photosensitive sensitive element 204 that may be used in an embodiment. For example, a non-pinned layer photodiode may alternatively be used. Other embodiments may utilize any suitable photosensitive element, and all of these photosensitive elements are intended to be included within the scope of the present disclosure.

The transfer transistor 206 is also merely representative of the many types of functional transistors or switches that may be utilized within the pixel region 104. For example, while the transistor is illustrated in FIG. 2 as a transfer transistor 206, embodiments of the invention may also include other transistors located within the pixel region 104, such as a reset transistor, source follower transistor, or a select transistor. These transistors may be arranged to form a four transistor CMOS image sensor (CIS). All suitable transistors and configurations that may be utilized in an image sensor are fully intended to be included within the scope of the present disclosure.

The transfer transistor 206 may comprise a gate dielectric 218 adjacent the substrate 202, a gate electrode 220 over the gate dielectric, and spacers 222 along the sidewalls of the gate dielectric 218 and gate electrode 220. Gate dielectric 218 and gate electrode 220 may be formed and patterned on the substrate 202 by any suitable process. The gate dielectric 218 may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. The gate dielectric 218 may have a relative permittivity value greater than about 4.

In an embodiment in which the gate dielectric 218 comprises an oxide layer, the gate dielectric 218 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In one embodiment, the gate dielectric 218 is between about 10 Å to about 150 Å in thickness, such as 100 Å in thickness.

The gate electrode 220 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon). In an embodiment in which the gate electrode 220 is poly-silicon, the gate electrode 220 may be formed by depositing doped or undoped poly-silicon by low-pressure chemical vapor deposition (LPCVD) to a thickness in the range of about 100 Å to about 2,500 Å, such as 1,200 Å.

Spacers 222 are formed on the sidewalls of the gate dielectric 218 and the gate electrode 220. The spacers 222 are typically formed by blanket depositing a spacer layer (not shown) on the previously formed structure. The spacer layer may comprise SiN, oxynitride, SiC, SiON, oxide, and the like, and may be formed by commonly used methods such as chemical vapor deposition (CVD), plasma enhanced CVD, sputter, and other methods known in the art. The spacer layer is then patterned to form the spacers 222, such as by anisotropically etching to remove the spacer layer from the horizontal surfaces of the structure.

A source/drain region 224 may be formed in the substrate 202 on an opposing side of the gate dielectric 218 from the photosensitive element 204. In an embodiment in which the substrate 202 is a p-type substrate, the source/drain region 224 may be formed by implanting appropriate n-type dopants such as phosphorous, arsenic, antimony, or the like. The source/drain region 224 may be implanted using the gate electrode 220 and the spacers 222 as masks to form lightly doped source/drain (LDD) regions and heavily doped source/drain regions.

It should be noted that one of ordinary skill in the art will realize that many other processes, steps, or the like may be used to form the source/drain region 224 and the photosensitive element 204. For example, one of ordinary skill in the art will realize that a plurality of implants may be performed using various combinations of spacers and liners to form the source/drain region 224 and the photosensitive element 204 having a specific shape or characteristic suitable for a particular purpose. Any of these processes may be used to form the source/drain region 224 and the photosensitive element 204, and the above description is not meant to limit the present invention to the steps presented above.

FIG. 2 further illustrates a p-well 226 and a deep p-well 228. The p-well 226 and the deep p-well may be formed using suitable implantation processes to implant p-type dopants (e.g., boron, gallium, indium, or the like) and provides device isolation. In an embodiment, the p-well 226 has a dopant concentration of about 1E11 to about 5E12, and the deep p-well 228 has a dopant concentration of about 1E11 to about 1E13.

One of ordinary skill in the art will appreciate that other components may be present. For example, metallization layers and interposing dielectric layers may be formed over the substrate 202 and the transistor 206, as well as contacts, through-substrate vias, and/or the like.

Figure 3:
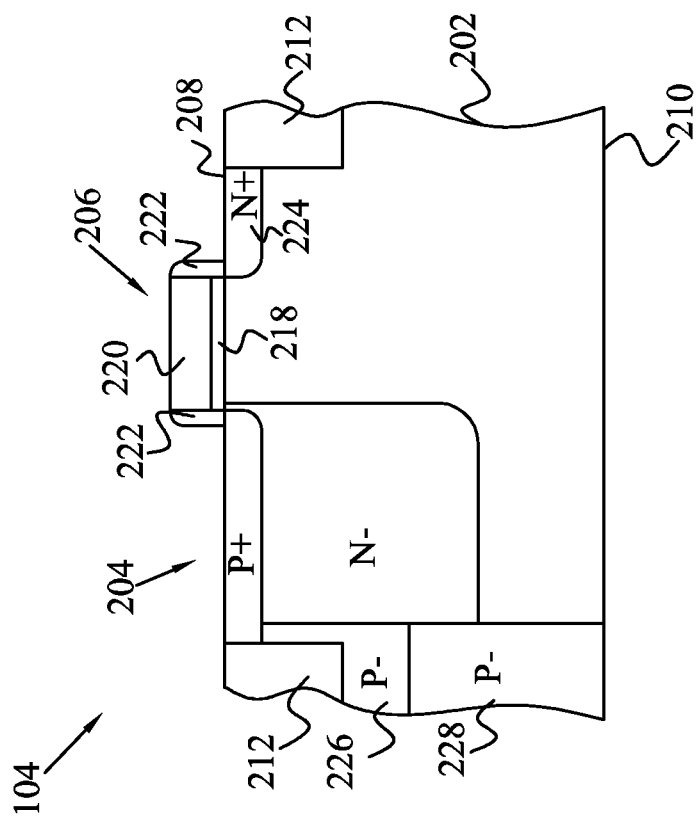

FIG. 3 illustrates an optional thinning of the backside 210 of the substrate 202 in accordance with an embodiment. Thinning reduces the distance that light travels through the backside 210 of the substrate 202 before it reaches the photosensitive element 204. The thinning of the backside 210 of the substrate 202 may be performed using a removal process such as chemical mechanical polishing (CMP). In a CMP process, a combination of etching materials and abrading materials are put into contact with the backside 210 of the substrate 202 and a grinding pad (not shown) is used to grind away the backside 210 of the substrate 202 until a desired thickness is achieved. However, any suitable process for thinning the backside 210 of the substrate 202, such as etching or a combination of CMP and etching, may alternatively be used. The backside 210 of the substrate 202 may be thinned to have a thickness of between about 1 μm and about 6 μm.

Figure 4:
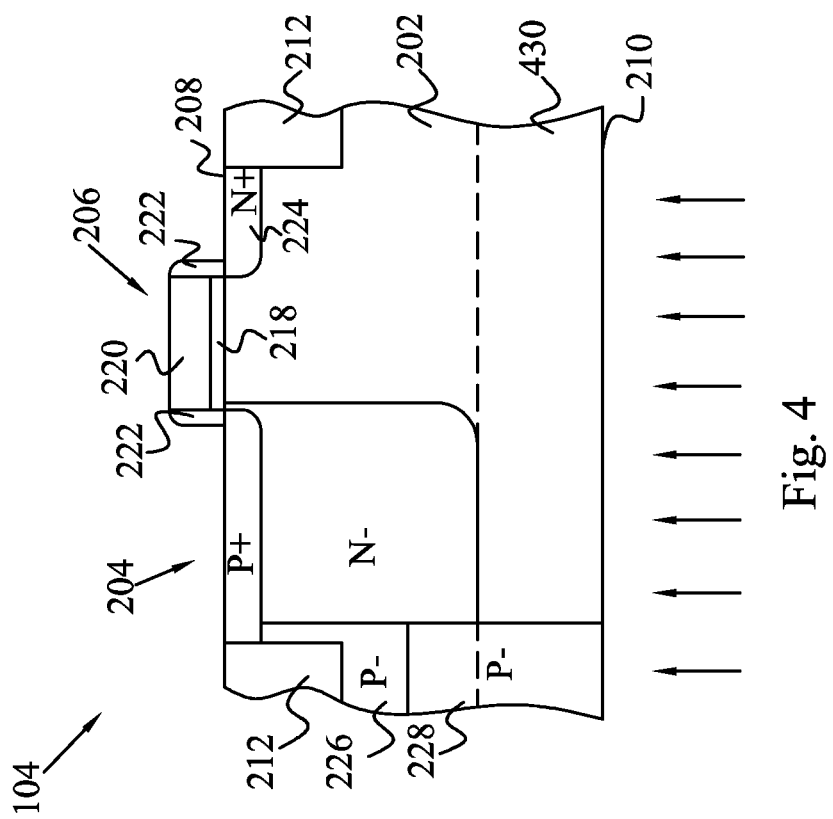

FIG. 4 illustrates a first implant process into the backside 210 of the substrate 202 in accordance with an embodiment. In an embodiment, the first implant process comprises a pre-amorphization implant (PAI) process, thereby creating a PAI implant region 430 extending from the backside 210 of the substrate 202 to a depth of about 10 Å to about 1,000 Å. This PAI process has been found to retard the diffusion of a subsequent implant, such as P+ implant discussed below with reference to FIG. 5. In this embodiment, the first implant process may utilize any suitable implant material. In an embodiment, a suitable implant material comprises a dopant other than a p-type and n-type dopant, such as Ge, C, N, F, and/or the like. For example, in an embodiment, Ge is implanted at a dose of about 1E11 to about 1E15 atoms/cm$^2$ and at an energy of about 1 to about 60 KeV, and to a depth from about 50 Å to about 1,000 Å.

Figure 5:
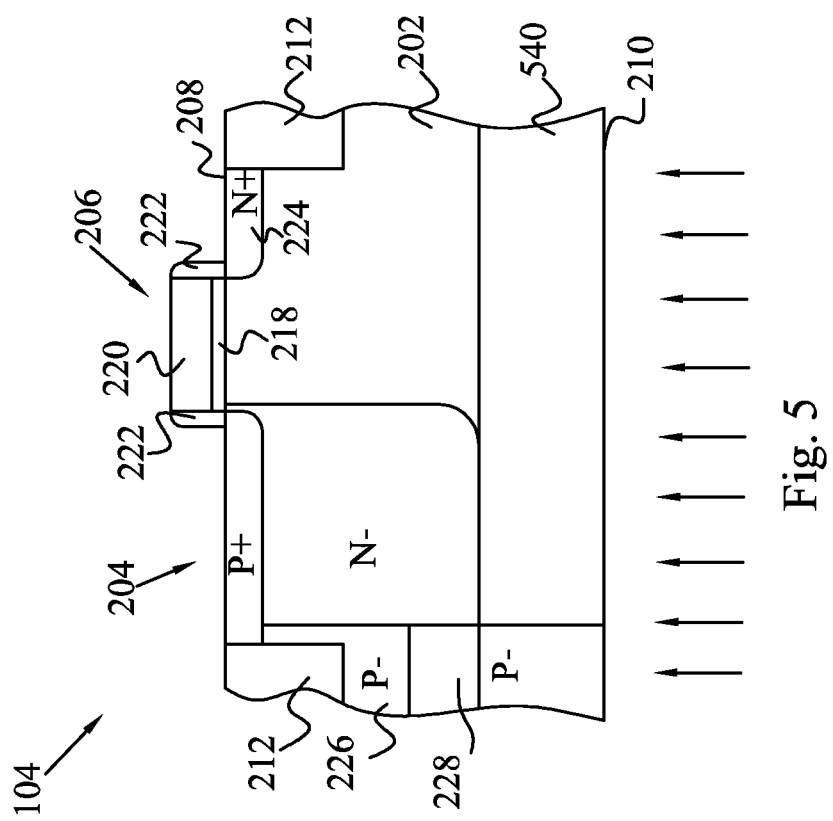

FIG. 5 illustrates a second implant process into the backside 210 of the substrate 202 in accordance with an embodiment. The second implant process may utilize a p-type dopant such as B, although one or more other suitable p-type dopants may be utilized in other embodiments. For example, in an embodiment, B is implanted at a dose of about 1E11 to about 1E15 atoms/cm2 and at an energy of about 1 to about 10 KeV.

In this manner, the second implant process creates a co-implant region 540 as illustrated in FIG. 5. For example, the co-implant region 540 comprises a PAI implant (e.g., Ge, C, N, F, or the like) and a P+ implant (e.g., B). It has been found that the PAI implant region 430 (see FIG. 4) reduces the tailing of the p-type dopant from the second implant process into the N− doped region 214. The PAI implant region 430 further allows a higher p-type dopant concentration near the surface of the backside 210, thereby covering the surface defect region and forming a deeper p-n junction between the P+ doped region of the co-implant region 540 and the N− doped region 214. Such a configuration may improve the white pixel as well as the dark current performance.

Thereafter, an anneal, such as a laser anneal, a thermal anneal, a rapid thermal anneal, or the like, may be performed. In addition to defect reduction, the anneal may recrystallize the amorphous region created by the first implant process discussed above with reference to FIG. 4.

Figure 6:
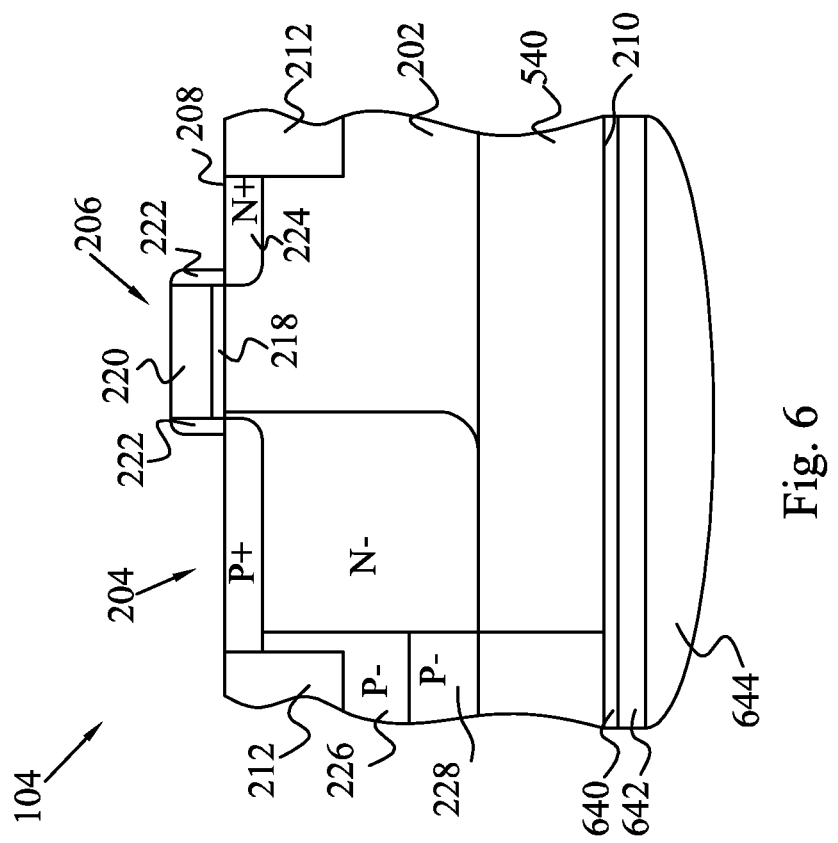

FIG. 6 illustrates the formation of an optional anti-reflective coating 640, an optional color filter 642, and an optional microlens 644 on the backside 210 of the substrate 202. The color filter 642 may comprise a filter for one of the primary colors (e.g., red, green, blue) and may be positioned to filter the light that will impinge upon the photosensitive element 204. The color filter 642 may comprise a polymeric material or resin, such as a polymeric polymer, which includes colored pigments.

The microlens 644 may be formed opposite the color filter 642 from the substrate 202, and may be used to focus impinging light more directly onto the photosensitive element 204. The microlens 644 may be formed by first applying and patterning a positive type photoresist (not shown) over the color filter 642. Once formed, the patterned photoresist may then be baked to round the photoresist into the curved microlens 644 as illustrated in FIG. 6.

Figure 7:
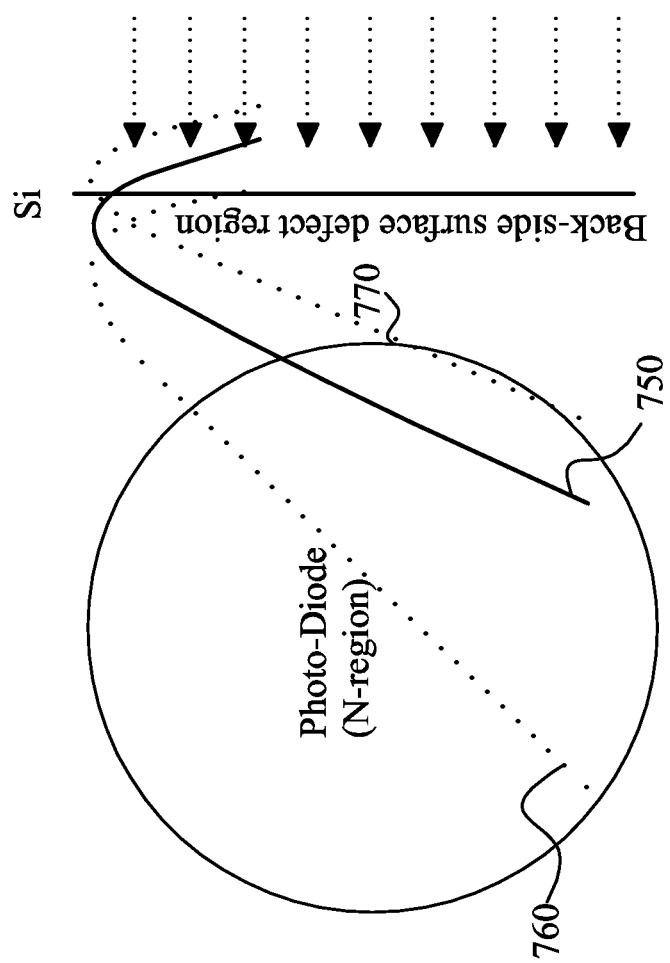
FIG. 7 illustrates plots comparing various types of implants.

FIG. 7 compares doping profiles for a Ge/B co-implant (line 750), a B single implant (line 760), and a BF$_2$ single implant (line 770). As illustrated in FIG. 7, the B single implant profile 760 tails into the N− doped region of the photosensitive element. A doping profile such as this may cause excessive current leakage, commonly referred to as a white pixel defect.

On the other hand, the BF2 single implant profile 770 illustrates a sharp and shallow profile, which may increase the current flow in the pixel region 104 in the absence of light, commonly referred to as the dark current defect.

The Ge/B co-implant profile 750 is not as sharp or shallow as the BF2 single implant profile 770, but also does not tail into the N-doped region of the photosensitive element as much as the B single implant profile 760. In this manner, the Ge/B co-implant profile 750 reduces both the white pixel defect and the dark current defect.

In a first embodiment, a device having a substrate that includes a pixel region is provided. A photosensitive element is positioned near a first side of the substrate in the pixel region, and a co-implant region is positioned nearer the second side of the substrate than the photosensitive element in the pixel region. The co-implant region includes a conductive dopant and a dopant other than a p-type dopant and an n-type dopant, such that the co-implant region has a different composition than the substrate.

In another embodiment, a device having a first doped region of a first conductivity type in a substrate is provided. The substrate has a second doped region of a second conductivity type below and adjacent to the first doped, and a third doped region of the first conductivity type on an opposing side of the second doped region from the first doped region. The third doped region being implanted with a material that is neither a p-type dopant nor an n-type dopant.

In yet another embodiment, a method is provided. A first doped region is formed in a substrate along a first side of the substrate and a second doped region beneath the first doped region, the first doped region having dopants of a first conductivity type, the second doped region having dopants of a second conductivity type. An implant step is performed to implant a first material into the second side of the substrate, the first material being a material other than a p-type dopant or an n-type dopant, and a third doped region is formed in the substrate along the second side of the substrate, the third doped region being positioned on opposing side of the second doped region from the first doped region, the third doped region having dopants of the first conductivity type.

Although the present invention and its advantages have been described in detail, it should be understood that various changes, substitutions and alterations can be made herein without departing from the spirit and scope of the invention as defined by the appended claims. For example, charge coupled devices (CCD) may be utilized in place of the CMOS devices within the image sensor, different materials may be utilized for the silicide contacts, or different methods of formation may be utilized for the various layers of material. These devices, steps and materials may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
    forming a photodiode in a substrate, the photodiode having a first doped region along a first side of the substrate and with a dopant of a first conductivity type, the photodiode further having a second doped region with dopant of a second conductivity type;
    creating an amorphous region along a second side of the substrate opposite the first side; and
    forming a third doped region in the substrate in a same region as the amorphous region and at least partially in the amorphous region, the third doped region being positioned on an opposing side of the second doped region from the first doped region and extending at least partially into the second doped region, the third doped region having a dopant of the first conductivity type.

2. The method of claim 1, wherein the amorphous region is formed by implanting a first material into the second side of the substrate, the first material being a material other than a p-type dopant or an n-type dopant.

3. The method of claim 2, wherein the first material comprises germanium, carbon, nitrogen, fluorine, or combinations thereof.

4. The method of claim 2, wherein the forming the amorphous region further comprises implanting the first material with a first doping profile, and wherein the forming the third doped region comprises forming the third doped region with a second doping profile different from the first doping profile.

5. The method of claim 1, wherein the second doped region is a photosensitive region.

6. A method comprising:
    forming a first doped region in a substrate and of a first conductivity type;
    forming a photosensitive region of a second conductivity type in the substrate, the photosensitive region adjacent to and below the first doped region;
    implanting a first material that is neither a p-type dopant or an n-type dopant in an implant region on an opposing side of the second doped region from the first doped region, the first material having first doping profile; and
    implanting a co-implant of the first conductivity type in the implant region, the co-implant having a second doing profile different from the first doping profile.

7. The method of claim 6, wherein the implanting the co-implant comprises implanting the co-implant at least partially into the second doped region.

8. The method of claim 6, wherein the implanting the first material comprises forming an amorphous region in the implant region.

9. The method of claim 6, wherein the first doped region and the photosensitive region form a p-n junction.

10. The method of claim 6, further comprising annealing after the implanting the co-implant.

11. The method of claim 6, wherein the first material comprises germanium, carbon, nitrogen, fluorine, or combinations thereof.

12. The method of claim 6, wherein the first material is selected to reduce tailing of the co-implant into the photosensitive region.

13. A device comprising:
    a first doped region in a substrate along a first side of the substrate and a second doped region beneath the first doped region, the first doped region having dopants of a first conductivity type, the second doped region having dopants of a second conductivity type;
    an amorphous region adjacent to a second side of the substrate and comprising a first material other than a p-type dopant or an n-type dopant; and
    a third doped region in the substrate and having a dopant of the first conductivity type, the third doped region at least partially in the amorphous region, and along the second side of the substrate, the third doped region being positioned on an opposing side of the second doped region from the first doped region and extending at least partially into the second doped region.

14. The device of claim 13, wherein the first material is selected to reduce tailing of the third doped region into the second region.

15. The device of claim 13, wherein the first material has a first doping profile and wherein the third doped region has a second doping profile different from the first doping profile.

16. The device of claim 13, wherein the first material comprises germanium, carbon, nitrogen, fluorine, or combinations thereof.

17. The device of claim 13, wherein second doped region is a photosensitive region.

18. The device of claim 17, further comprising a color filter on the second side of the substrate.

19. The device of claim 18, further comprising a microlens on the second side of the substrate.

20. The device of claim 13, wherein the first doped region and the second doped region comprise a p-n junction.

* * * * *